United States Patent [19]
Raisig et al.

[11] Patent Number: 4,547,652
[45] Date of Patent: Oct. 15, 1985

[54] PROCESS FOR THE LASER SOLDERING OF FLEXIBLE WIRING

[75] Inventors: Hermann Raisig, Munich; Gregor Unger; Oscar Wirbser, both of Germering, all of Fed. Rep. of Germany

[73] Assignee: Siemens Aktiengesellschaft, Berlin & Munich, Fed. Rep. of Germany

[21] Appl. No.: 560,776

[22] Filed: Dec. 12, 1983

[30] Foreign Application Priority Data

Dec. 21, 1982 [DE] Fed. Rep. of Germany ....... 3247338

[51] Int. Cl.⁴ .............................................. B23K 26/00
[52] U.S. Cl. ........................ 219/121 LD; 219/121 LC
[58] Field of Search ................. 219/121 LC, 121 LD, 219/121 L, 121 LM, 121 LE, 121 LF

[56] References Cited

U.S. PATENT DOCUMENTS 3,614,832  10/1971  Chance et al. ................ 219/121 LD

FOREIGN PATENT DOCUMENTS 2735231  2/1979  Fed. Rep. of Germany ...... 219/121 LD Primary Examiner—C. L. Albritton
Attorney, Agent, or Firm—John Francis Moran

[57] ABSTRACT

A method for laser soldering of soldered connections of flexible wiring, which are provided at their contact points with a flux. The parts to be joined are held together by a clamp made of translucent material. The transmission of heat for the soldering process is provided by a non-contact laser beam. When the laser beam is applied the solder on both strip conductors melts. Upon removing the heat source the connection hardens to a solid solder joint.

5 Claims, 2 Drawing Figures

PROCESS FOR THE LASER SOLDERING OF FLEXIBLE WIRING

BACKGROUND OF THE INVENTION

This invention relates to a process for laser soldering of flexible wiring, in particular, to soldering of wiring mounted on a brittle substrate.

In order to join two parts by means of soldering it has been possible to use, for a direct transmission of heat, the metallization of one part, or to transmit the heat for the soldering process indirectly over soldered strip conductors.

Spot-welding (soldering) of connections on hybrid circuits has only very recently come under consideration as a possible application for a laser. In a welding process, the materials to be welded are brought to the melting point which results in a direct joining of the two materials. A prerequisite for a permanent joint is the availability of sufficient material. When this condition is not satisfied, a soldering process must be used. For this purpose the materials must be covered with a solderable mass (soft or hard solder). In this case the laser acts as a source of heat, which operates very precisely only on the exact points to be joined. This process cannot be used to solder flexible wiring to glass substrates.

SUMMARY OF THE INVENTION

It is an object of the invention to describe a process which makes it possible to solder flexible wiring which is not amenable to heat transfer by means of a soldering iron or similar tool. The objective is realized as follows: In order to solder flexible wiring that is arranged on a translucent carrying film and has been provided at the contact points with a flux, the parts to be joined are held together by a clamp made of transparent material in such a manner that they are fixed in the desired position with regard to one another, and the wires that are opposite one another are in contact with the surfaces to which the solder has been applied, and the non-contact heat transmission for the soldering process is provided by a laser beam. Since the heat transmission is accomplished without contact, there is no danger of breakage when glass substrates are used, since no forces are exerted on the substrate. The carrying film is not damaged and the heat distribution is maintained.

According to a further preferred embodiment of the invention, the laser used is preferably a continuous wave solid-state Nd:YAG laser. This laser's wavelength of 1.064 um is particularly well-suited for a soldering process of this type.

In order to apply the heat over a substantial area and to prevent damage to the carrying film, it is preferable to use a defocused laser beam. The defocused non-contact heat source ensures that no injury occurs to the joint between the conductors and the film, and also that no impairment of the metallization due to deterioration of alloys results. In addition, overheating is avoided by this process.

Other features and advantages of the invention will be apparent from the following description of the preferred embodiments, and from the claims.

For a full understanding of the present invention, reference should now be made to the following detailed description of the preferred embodiments of the invention and to the accompanying drawings.

DETAILED DESCRIPTION

Figure 1:
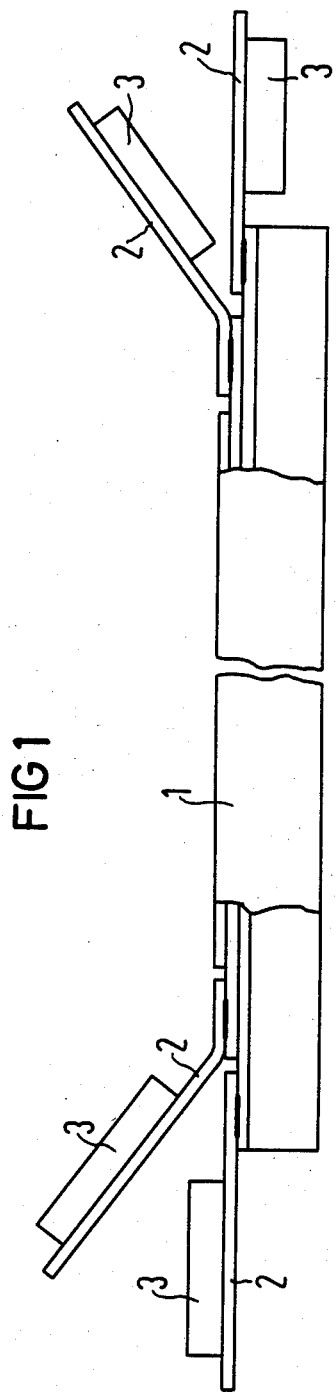
FIG. 1 shows the glass carrier in a side view.

Preferred embodiments of the invention will now be described with reference to the drawings.

Reference numeral 1 is used to designate a glass carrier. Reference numeral 2 shows the wiring to be connected. Components on the wiring films are designated by 3.

Figure 2:
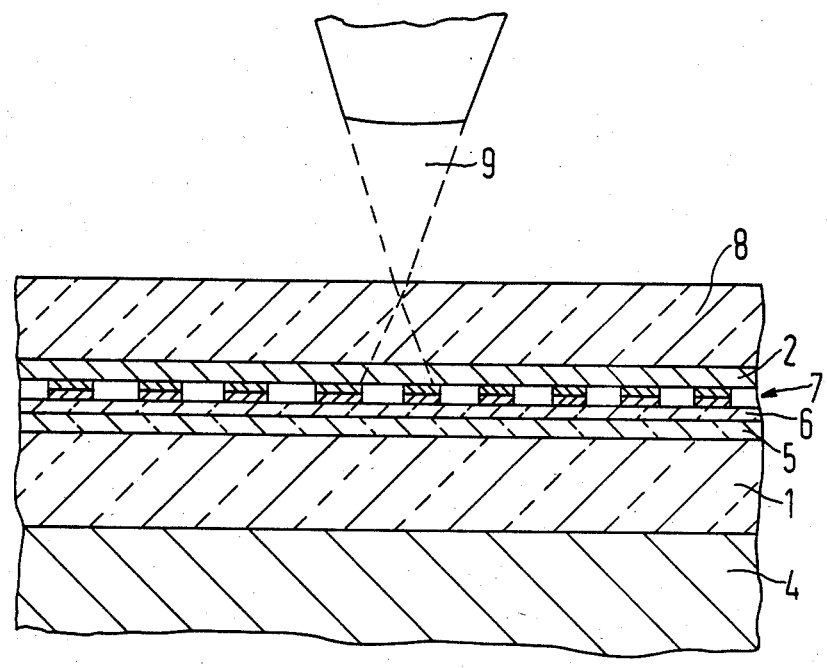
FIG. 2 shows the application of the invention to a section of a glass carrier of this type.

As shown in FIG. 2, the glass carrier 1 lies on a holder 4. The joint between the glass carrier 1 and the glass substrate 6 consists of glass solder 5. Reference number 7 indicates the external connections of the strip conductors to be joined between the connecting wiring and the glass substrate. The parts to be joined are held together by a clamp 8 made of transparent material, for example, glass. The laser beam is identified by reference numeral 9.

As may be seen in FIG. 2, according to this embodiment the strip conductors are covered in one direction of the flexible wiring by a polyamid film and in the other direction by the glass substrate 6. The external terminals that are to be joined are held together by the clamp 8. A heat track is traced with a continuous wave laser and the solder is thus preheated and melted. The next step is the stress-free hardening of the solder to form a solid solder joint. Using this process, a large number of adjacent connections can be made in one operation.

The process described in the invention is particularly well-suited for the soldering of flexible wiring to the wiring of printed circuit boards made of glass, ceramics or plastics.

There has thus been shown and described a novel method for flexible wiring soldering which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A method for laser soldering of soldered connections of flexible wiring, wherein said method comprises the steps of:
   (a) arranging said wiring on a transparent carrying film;
   (b) providing said wiring at their respective contact points with a flux to promote thermal conduction therebetween;
   (c) holding said contact points together by a clamp of transparent material so that they may be joined, said contact points being arranged so that surfaces to be joined are in contact with each other; and
   (d) applying a non-contact heat source from a laser beam to said contact points to generate a solder connection.

2. A process according to claim 1, wherein the step of applying includes generating said laser beam using a solid-state Nd:YAG laser.

3. A process according to claim 1, wherein the step of applying includes defocusing said laser beam.

4. A process according to claim 2, wherein the step of generating includes operating said solid-state Nd:YAG laser at a wavelength of 1.064µ meter.

5. A process according to claim 3, wherein the defocusing of said laser beam melts the transparent carrying film so it penetrates between said wiring to strengthen said solder connection.

* * * * *